United States Patent [19]

Hausman et al.

[11] Patent Number: 4,978,927
[45] Date of Patent: Dec. 18, 1990

[54] PROGRAMMABLE VOLTAGE CONTROLLED RING OSCILLATOR

[75] Inventors: Kristen A. Hausman, Delray Beach, Fla.; Gene J. Gaudenzi, Purdys, N.Y.; Joseph M. Mosley, Boca Raton, Fla.; Susan L. Tempest, Poughkeepsie, N.Y.

[73] Assignee: International Business Machines Corporation, Armonk, N.Y.

[21] Appl. No.: 433,260

[22] Filed: Nov. 8, 1989

[51] Int. Cl.$^5$ ............................................... H03B 5/00
[52] U.S. Cl. ..................................... 331/57; 331/179; 331/DIG. 3
[58] Field of Search ..................... 331/57, DIG. 3, 179

[56] References Cited

U.S. PATENT DOCUMENTS

| | | | |
|---|---|---|---|
| 3,931,588 | 1/1976 | Gehweiler | 331/57 |
| 4,105,950 | 8/1978 | Dingwall | 331/57 |
| 4,392,105 | 7/1983 | McLeod | 331/57 X |
| 4,517,532 | 5/1985 | Neidorff | 331/57 |
| 4,617,529 | 10/1986 | Suzuki | 331/57 |
| 4,625,181 | 11/1986 | Bichler | 331/57 |
| 4,656,369 | 4/1987 | Lou | 307/297 |
| 4,680,480 | 7/1987 | Hopta | 307/455 X |
| 4,694,261 | 9/1987 | Ewen et al. | 331/57 |
| 4,695,808 | 9/1987 | Cabaniss et al. | 331/57 |

OTHER PUBLICATIONS

IBM Technical Disclosure Bulletin, vol. 30, No. 3, Aug. 1987, pp. 1181–1182.
IBM Technical Disclosure Bulletin, vol. 31, No. 2, Jul. 1988, pp. 154–156.

Primary Examiner—Siegfried H. Grimm
Attorney, Agent, or Firm—Martin J. McKinley

[57] ABSTRACT

Each section (e.g., 102) of the ring oscillator consists of three two-input NOR gates; one in the feedforward path (108), one in the feedback path (112), and one in the crossover path (110). The center frequency of the oscillator is controlled by enabling and disabling the appropriate gates, such that a single closed loop path is formed. The gates in the feedforward and crossover paths are directly enabled or disabled (to disable, either input is held high) from a control circuit (FIG. 2). The gates in the feedback path, however, are indirectly enabled and disabled. To enable a particular feedback path gate (e.g., 118), either the corresponding crossover gate (116) is disabled, or the corresponding feedforward gate is disabled (114) and the crossover gate (122) in the following section is enabled. The later causes the feedback gate (124) in the following section to be disabled, thereby removing the remaining sections (106) of the oscillator from the closed loop path. The NOR gates are implemented as a differential amplifier (FIG. 5) having two transistors (610 and 612) in the input leg and one transistor (616) with its base connected to a regulated voltage (Vr) in the opposite leg. The output of the NOR gate is taken from the collectors of the input transistors. The propagation delay of the oscillator signal through the gate is minimal because, to switch the output state of the gate, only the state of one of the input transistors (610 or 612) must be changed. The short propagation delay through the gate permits high frequency operation, as well as the ability to program small incremental steps in the center frequency of the oscillator.

8 Claims, 2 Drawing Sheets

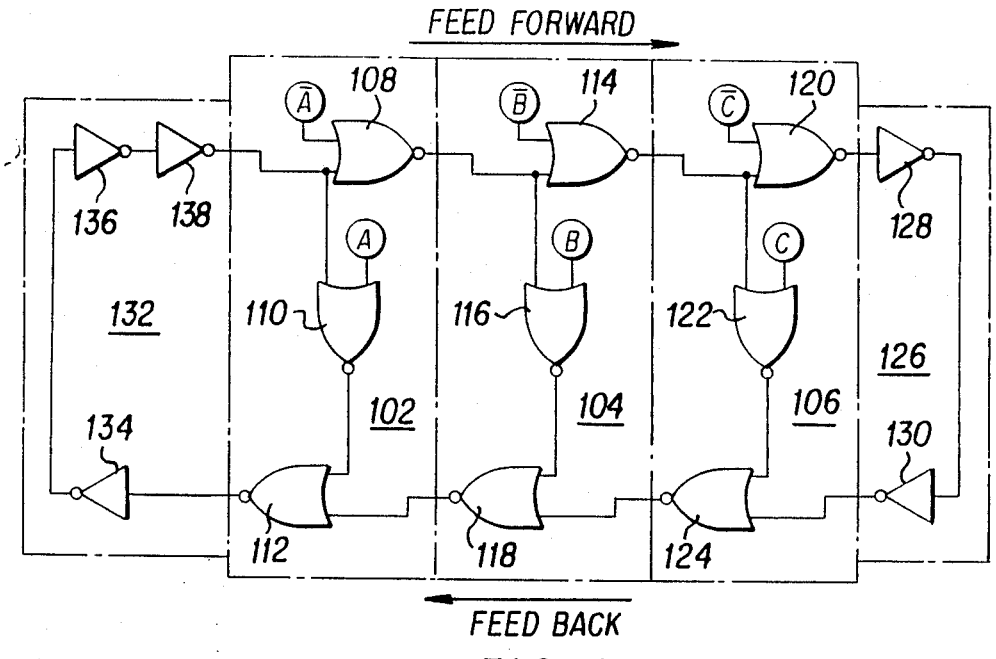
FIG. 1
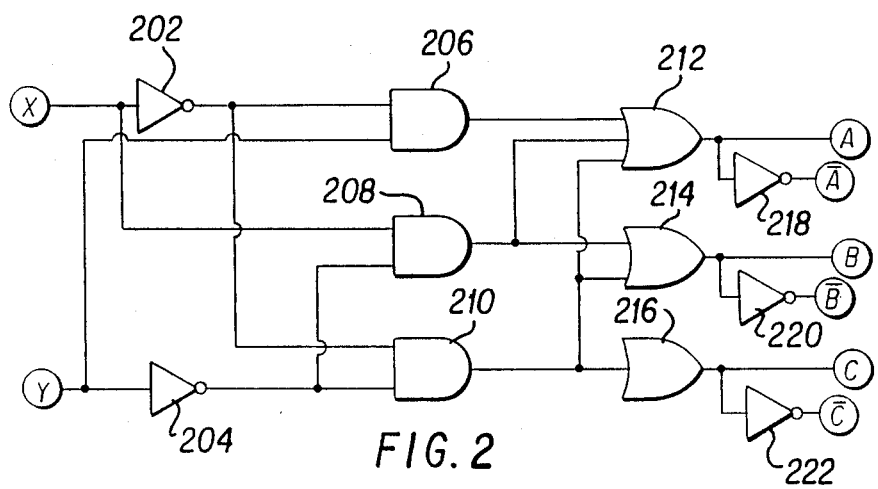
FIG. 2
```
Y X  A B C
0 0  1 1 1
0 1  1 1 0
1 0  1 0 0
1 1  0 0 0
```
FIG. 3

PROGRAMMABLE VOLTAGE CONTROLLED RING OSCILLATOR

BACKGROUND of the INVENTION

This invention pertains to oscillators and, more particularly, to a voltage controlled ring oscillator and the control circuitry for programming the oscillator.

In a ring oscillator, the number of delay elements connected in a closed loop, as well as the propagation delay of each of those elements, determines the frequency of oscillation; or, if the ring oscillator is voltage controlled, the center frequency of oscillation. Consequently, for a given number of delay elements connected in a closed loop, higher frequency of operation may be achieved if the propagation delay through each element can be reduced.

If the number of delay elements in the closed loop can be changed, the frequency of oscillation can be made to be programmable. But, switching in or out delay elements can only change the frequency of the oscillator in incremental steps. Therefore, if the propagation delay through each delay element can be reduced, better resolution, i.e., finer adjustments in the frequency of the oscillator can also be achieved.

Accordingly, the invention described below achieves both high frequency of operation and frequency programmability in small incremental steps by the use of a delay element that consists of two, two-input NOR gates. Furthermore, the NOR gates are implemented in a bipolar structure which only requires the input signal to the gate to change the state of one transistor in order to effect a change in the output of the gate. Consequently, the propagation delay through each of the gates is minimal and the number of transistors needed to implement the oscillator circuit is also minimal.

SUMMARY of the INVENTION

Briefly, the invention is a programmable ring oscillator that includes first, second and third gates. A first input of the first gate is coupled to a first input of the second gate, and the output of the second gate is coupled to a first input of the third gate. The oscillator also includes first and second circuits. The first circuit is coupled between the output of the first gate and a second input of the third gate. The second circuit is coupled between the output of the third gate and the first input of the first gate. The oscillator has first and second selectable oscillator signal paths. The first path is through the first gate, the first circuit, the third gate and the second circuit. The second path is through the second and third gates, and the second circuit.

In another embodiment, the programmable ring oscillator includes a first circuit section having first, second and third gates. A first input of the first gate is coupled to a first input of the second gate, and the output of the second gate is coupled to a first input of the third gate. Also included is a second circuit section having fourth, fifth and sixth gates. The output of the first gate is coupled to a first input of the fourth gate and to a first input of the fifth gate. The output of the fifth gate is coupled to a first input of the sixth gate and the output of the sixth gate is coupled to a second input of the third gate. The oscillator also includes first and second circuits. The first circuit is coupled between the output of the fourth gate and a second input of the sixth gate. The second circuit is coupled between the output of the third gate and the first input of the first gate. The programmable ring oscillator has first, second and third selectable oscillator signal paths. The first path is through the first and fourth gates, the first circuit, the sixth and third gates, and the second circuit. The second path is through the first, fifth, sixth and third gates, and the second circuit. The third path is through the second and third gates and the second circuit.

BRIEF DESCRIPTION of the DRAWINGS

FIG. 1 is a schematic diagram of a particular embodiment of the ring oscillator of the current invention having three programmable sections.

FIG. 2 is a schematic diagram of one embodiment of the control circuit for the ring oscillator of FIG. 1.

FIG. 3 is a truth table of the output states (A, B and C) of the control circuit of FIG. 2 as a function of state of the input selection lines (X and Y).

DESCRIPTION of the PREFERRED EMBODIMENTS

Figure 4:
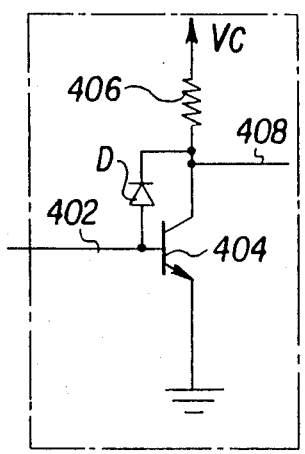
FIG. 4 is a schematic diagram of the preferred embodiment of the inverter circuit used in the ring oscillator and associated control circuit.

In FIG. 1, a schematic diagram of one embodiment of the invention is illustrated that includes three (3) programmable sections. Referring to this figure, the programmable ring oscillator includes three programmable circuit sections 102, 104 and 106. Each of the sections 102, 104 and 106 includes three two-input NOR gates. Specifically, first section 102, second section 104 and third section 106 include, respectively, NOR gates 108, 114 and 120 in the "feedforward" path, gates 112, 118 and 124 in the "feedback" path and gates 110, 116 and 122 in the "crossover" path. Although NOR gates are preferred, NAND gates are also suitable.

A first circuit 126 comprising inverters 128 and 130 connects the output from the feedforward path of the last programmable circuit section 106 (at gate 120) to the input at the feedback path of the last section (at gate 124). Although two inverter stages are preferred, any non-inverting circuit may be suitable for first circuit 126. Similarly, a second circuit 132 comprising inverters 134, 136 and 138 connects the output from the feedback path of the first programmable circuit section 102 (at gate 112) to the input of the feedforward path of the first section (at gate 108). Although three inverting stages are preferred, any inverting circuit may be suitable for second circuit 132.

The NOR gates 108, 114 and 120 in the feedforward path and the NOR gates 110, 116 and 122 in the crossover path are directly enabled or disabled from a control circuit, such as the one described below with reference to FIG. 2. To enable a NOR gate, a logic zero is applied to one of the inputs of the gate. When so enabled, the signal applied to the other input of the gate will appear at the output of the gate, inverted. To disable a NOR gate, a logic one is applied to one of the inputs of the gate. When so disabled, the output of the gate is forced low and, consequently, a signal applied to the other input of the gate will not appear at the output.

The NOR gates 112, 118 and 124 in the feedback path are indirectly enabled or disabled. To enable a particular feedback path gate, either the corresponding crossover gate is disabled, or the corresponding feedforward gate is disabled and the crossover gate in the following section is enabled. The later causes the feedback gate in the following section to be disabled, thereby removing the remaining sections of the oscillator from the closed loop path.

The three programmable section oscillator of FIG. 1 has four (4) selectable paths for the oscillator signal. The first path which is the highest frequency path, is through NOR gates 110 and 112, and second section 132. The second path is through NOR gates 108, 116, 118 and 112, and second circuit 132. The third path is through NOR gates 108, 114, 122, 124, 118 and 112, and second circuit 132. The fourth path, which is the lowest frequency path, is through NOR gates 108, 114 and 120, first circuit 126, NOR gates 124, 118 and 112, and second circuit 132. The selection of each of these paths will be described in more detail below, with reference to the description of the control circuit of FIG. 2.

The two inverters 128 and 130 of first circuit 126 are, preferably, equal in propagation delay to that of the NOR gates in the crossover and feedback paths. This can be reasonably assured by replacing the inverters 128 and 130 with NOR gates identical to the ones in the programmable sections and with the second input of the gate continuously enabled (pulled low). This provides that the incremental difference in the oscillator signal period remains constant, even when an oscillator signal path through the first circuit 126 is selected.

Three inverting stages 134, 136 and 138 are preferred for second circuit 132 because, this limits the shortest programmable oscillator signal path to five (5) inverting stages. Although a single inverting stage may be used in second circuit 132, the shortest programmable signal path would only include three inverting stages (NOR gates 110 and 112, and second circuit 132). When using the bipolar technology illustrated in FIGS. 4 or 6 and, if only three inverting stages are included in the oscillator signal path, the signal may be more sawtooth shaped than square.

The invention can be constructed with a minimum of one programmable circuit section and first and second circuits 126 and 132. When only one programmable section is used, there will be two selectable oscillator paths and, consequently, two selectable oscillator frequencies. As previously mentioned, the second circuit 132 only needs to include one inverting stage. In the alternative, the invention may be constructed using any number of programmable circuit sections, or any technology, e.g., bipolar, NMOS, CMOS, etc.

In FIGS. 2 and 3, a schematic diagram of the preferred control circuit and the corresponding truth table are illustrated, respectively. Referring to these figures, the "X" and "Y" inputs are the control inputs to the circuit. The circuit includes two (2) inverters 202, 204, 218, 220 and 222; three (3) AND gates 206, 208 and 210; and three (3) OR gates 212, 214 and 216. When utilizing the OR circuit of FIG. 6, inverters 218, 220 and 222 are unnecessary since the illustrated OR gate has both inverted and non-inverted outputs. The single input OR gate 216 is provided to ensure that all three control signals "A", "B" and "C" arrive at the control inputs of gates 108, 110, 114, 116, 120 and 122 at substantially the same time.

By appropriately setting or clearing the "X" and "Y" input lines, one of the four oscillator signal paths described above is selected. Referring to FIG. 3 and starting at the bottom of the table, the four input conditions 11, 10, 01 and 00 for "Y" and "X" correspond, respectively, to the four oscillator signal paths described above. For example, when the second path is selected in which the oscillator signal propagates through NOR gates 108, 116, 118 and 112 and second circuit 132, crossover gate 110 is disabled ("A" is a logic one which forces the output of this gate low) and crossover gates 116 and 122 are enabled ("B" and "C" are at logic zero which causes the signal at the other input of the gate to appear at the output of the gate, inverted). Similarly, feedforward gate 108 is enabled and gates 114 and 120 are disabled.

In addition, feedback gates 112 and 118 are indirectly enabled and feedback gate 124 is indirectly disabled. Recall that crossover gate 110 is disabled because "A" is set to a logic one. This causes a logic zero at the output of this gate, which is coupled to the input of feedback gate 112. But a logic zero at one input of gate 112 enables the gate, such that the signal at the output of gate 118 appears at the output of gate 112, inverted.

Feedback gate 118 is also enabled indirectly, however, via a different mechanism. Recall that feedforward gate 114 is disabled and crossover gate 122 is enabled. Since gate 114 is disabled its output is low. But, crossover gate 122 is enabled so that the low output from gate 114 is inverted to a logic one. This logic one is coupled to one of the inputs of feedback gate 118, which enables gate 118 such that the oscillator signal at the output of crossover gate 116 appears at the output of feedback gate 118, inverted. Note also that the logic one at the input to feedback gate 124 disables that gate, thereby removing the remaining sections of the oscillator from the closed loop path (in the three programmable section oscillator of FIG. 1, the only section that is "removed" when the second path is selected is the first circuit 126).

FIG. 4 is a schematic diagram of a bipolar implementation of the inverter circuits of FIGS. 1 and 2. Referring to this figure, input 402 of the inverter is coupled to the base of NPN transistor 404. A pull-up resistor 406 is connected between the collector of the transistor and the voltage Vc. The output 408 of the inverter circuit is taken at the collector of the transistor. Diode(s) "D" is a Schottky diode which speeds the performance of the transistor by preventing it from being driven into saturation.

Figure 5:
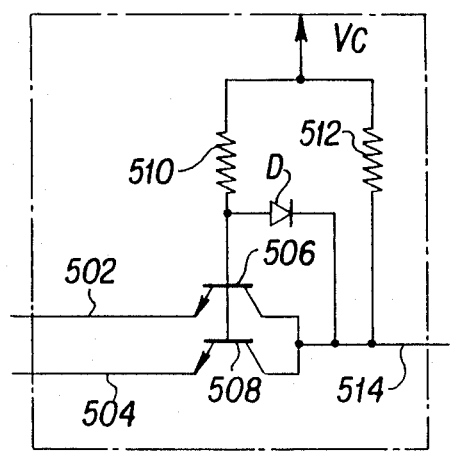
FIG. 5 is a schematic diagram of the preferred embodiment of the AND gate used in the control circuit of FIG. 2.

FIG. 5. is a schematic diagram of a bipolar implementation of AND gates 206, 208 and 210 of FIG. 2. Referring to this figure, gate inputs 502 and 504 are connected, respectively, to the emitters of NPN transistors 506 and 508. A biasing resistor 510 is connected between Vc and the base of both transistors. A pull-up resistor 512 is connected between Vc and the collectors of both transistors, where the output 514 of the gate is taken. In operation, if both gates are high, transistors 506 and 508 are switched OFF, and the output 514 is pulled high through resistor 512. If one of the inputs goes low, current flows through bias resistor 510 and the base emitter circuit of the corresponding transistor; switching the transistor ON and pulling the output low.

Figure 6:
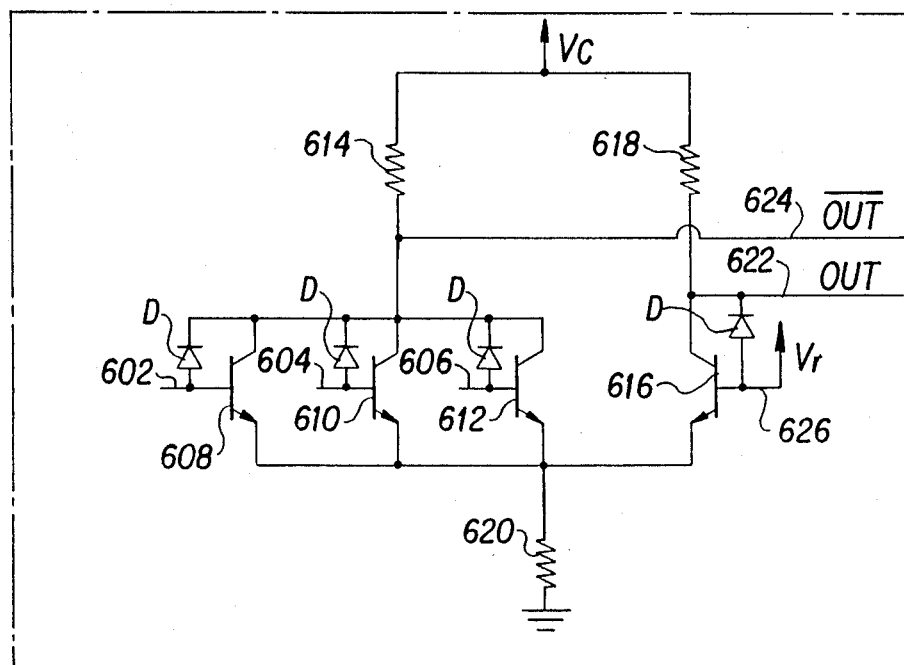
FIG. 6 is a schematic diagram of the preferred embodiment of the NOR and OR gates used in the ring oscillator and associated control circuit.

FIG. 6 is a schematic diagram of the preferred implementation of the three input OR gate 212 of FIG. 2. Inputs 602, 604 and 606 are connected, respectively, to the bases of the input transistors 608, 610 and 612. A resistor 614 is connected between the collectors of transistors 608, 610 and 612, and voltage Vc. The collector of a fourth transistor is connected to Vc through resistor 618. The emitters of all transistors are mutually connected and coupled to ground through an emitter resistor 620. The output 622 is taken at the collector of transistor 616 and the inverted output 624 at the collectors of transistors 608, 610 and 612. Thus, the OR gate is configured as a differential amplifier with the "inverting" input 626 of the circuit connected to a reference voltage Vr, which is intermediate ground and Vc potential (preferably, centered between logic one and logic zero).

The particular embodiment illustrated in the figure is for a three input gate, although any number of inputs may be fashioned by simply adding or deleting one of the input transistors. For example, the circuit for two-input OR gate 214 simply deletes transistor 612.

The NOR gates of the ring oscillator of FIG. 1 use the circuit of FIG. 6, except that the output is taken at the inverted output 624, rather than the non-inverted output 622; and only two input transistors 608 and 610 are included. In operation, if the voltage at one of the input transistors (610 or 612) exceeds the reference voltage Vr, the corresponding input transistor begins to conduct, thereby pulling the voltage at the inverted output 624 down. Simultaneously, the emitter voltage of the transistors begins to rise, thereby decreasing the forward bias across the base emitter junction of reference transistor 616 and, consequently, decreasing the current through transistor 616. This causes the non-inverted output 622 to be pulled up through resistor 618.

When operated as a NOR gate, the input signal at 604 or 606 only has to effect the state of one transistor (respectively, 610 or 612). Consequently, the propagation delay from input to inverted output is minimal. This not only permits the oscillator to operate at higher frequencies, but also permits finer adjustment of the center frequency since each additional programmable section (e.g., 102) that is programmed into the closed oscillator loop adds a very small increment of time to the period of the oscillator signal.

The differential amplifier structure of the NOR gates also provides another advantage. Specifically, the symmetrical operation of the gate, that is, the propagation delay through the gate is substantially equal in going from low to high, as it is in going from high to low, produces an oscillator signal that has a 50-50 duty cycle.

The ring oscillator can be operated as a conventional oscillator with a fixed input voltage, or as a voltage controlled oscillator. When operated as a voltage controlled oscillator, the control voltage is connected to Vc. The preferred application for the current invention is as a voltage controlled oscillator (VCO) in a phase lock loop circuit for a computer clock generator.

We claim as our invention:

1. A programmable ring oscillator, comprising in combination:

a first circuit section including first, second and third gates, a first input of said first gate being coupled to a first input of said second gate, the output of said second gate being coupled to a first input of said third gate;

a second circuit section including fourth, fifth and sixth gates, the output of said first gate being coupled to a first input of said fourth gate and to a first input of said fifth gage, the output of said fifth gate being coupled to a first input of said sixth gate, the output of said sixth gate being coupled to a second input of said third gate;

a first circuit coupled between the output of said fourth gate and a second input f said sixth gate; and a second circuit coupled between the output of said third gate and said first input of said first gate, such that said programmable ring oscillator has first, second and third selectable oscillator signal paths, said first path being through said first and fourth gates, said first circuit, said sixth and third gates and said second circuit; said second path being through said first, fifth, sixth and third gates, and said second circuit; said third path being through said second and third gates and said second circuit.

2. The programmable ring oscillator of claim 1, further comprising:

control means for selecting one of said first, second and third signal paths, said control means being coupled to a second input of each of said first, second, fourth and fifth gates;

said control means supplying an enabling signal to said first and fourth gates, and a disabling signal to said second and fifth gates when said first signal path is selected;

said control means supplying an enabling signal to first and fifth gates and a disabling signal to said second and fourth gates when said second signal path is selected; and said control means supplying an enabling signal to said second and fifth gates, and a disabling signal to said first and fourth gates when said third signal path is selected, said disabling signal to said first gate causing said sixth gate, through said fifth gate, to output an enabling signal to said third gate.

3. The programmable ring oscillator of claim 2, wherein said first, second and third gates are NOR gates.

4. The programmable ring oscillator of claim 2, wherein said first, second and third gates are NAND gates.

5. The programmable ring oscillator of claim 2, wherein said first gate includes a differential amplifier structure having first, second and third transistors, the first terminals of said first, second and third transistors being coupled, the second terminals of said first and second transistors being coupled to said first and second inputs of said first gate, respectively, the third terminals of said first and second transistors being coupled to said output of said first gate.

6. The programmable ring oscillator of claim 1, wherein said first, second and third gates are NOR gates.

7. The programmable ring oscillator of claim 1, wherein said first, second and third gates are NAND gates.

8. The programmable ring oscillator of claim 1, wherein said first gate includes a differential amplifier structure having first, second and third transistors, the first terminals of said first, second and third transistors being coupled, the second terminals of said first and second transistors being coupled to said first and second inputs of said first gate, respectively, the third terminals of said first and second transistors being coupled to said output of said first gate.

* * * * *